HIGH GAIN SILICON PHOTODETECTOR

Filed Dec. 29, 1965

INVENTORS:
GLEN C. GERHARD,
SAMUEL W. ING,
BY Richard V. Lang
THEIR ATTORNEY.

United States Patent Office 3,436,613

Patented Apr. 1, 1969

3,436,613
HIGH GAIN SILICON PHOTODETECTOR

Glen C. Gerhard, Camillus, and Samuel W. Ing, Webster, N.Y., assignors to General Electric Company, a corporation of New York Filed Dec. 29, 1965, Ser. No. 517,366
Int. Cl. H01l 15/02
U.S. Cl. 317—234 8 Claims

ABSTRACT OF THE DISCLOSURE

The silicon photodetector herein described utilizes intrinsic rather than junction photoconductive properties. It has a first layer which is degeneratively doped and which provides an electrical contact to a thin epitaxial layer in which photodetection takes place, followed by a third layer which is optically transmissive and provides the second electrical contact to the epitaxial layer. The epitaxial layer is moderately doped and has strong gold compensation, below the level, however, that would create junction regions. These and other measures provide for both sensitive and high speed photodetection at normal ambient temperatures.

The invention relates to a photodetector particularly suitable for use as a light receptor in radiative interconnection arrangements. Such arrangements are those described in the copending application of Barrett et al. "Radiative Interconnection Arrangement," S.N. 517,396 filed concurrently.

In this and other such applications, the need has arisen for the provision of a photodetector able to operate at megacycle frequencies with a quantum gain greater than one. These objectives encompass a very large number of signal information coupling needs as for instance those required in data processing circuitry, as well as in many types of communication. It is also highly desirable that the light receptor be compatible with available modulable light sources such as the recently developed gallium arsenide devices which provide light in the far red or near infrared region of the spectrum.

Finally, it is also desirable that such light receptor devices be compatible with the integrated circuit techniques which today involve the formation of extremely complex circuits upon single monolithic substrates of semiconductor material.

Accordingly, it is an object of the present invention to provide an improved photodetector of high speed and substantial quantum gain.

It is a further object of the present invention to provide an improved photodetector capable of operating in the visible and near infrared regions of the optical spectrum and in particular capable of operation with gallium arsenide light sources.

It is a further object of the invention to provide an improved photodetector compatible with fabrication by integrated circuit techniques.

These and other objects of the invention have been achieved in one practical form of the invention by a photodetector device of wafer-like configuration comprising three successive layers of which the first layer is of degeneratively doped silicon providing a first ohmic contact for the device;

The second layer is of epitaxially grown material having a thickness suitable for light absorption, said epitaxial layer being moderately doped with an impurity of similar type to that in the first layer, and being compensated by an impurity of opposite kind to effectively depopulate the conduction band of free carriers at room temperatures; and A third layer comprising a light permeable electrical contact means upon said epitaxial layer comprising a thin region heavily doped with an impurity of a similar type to that in the first layer, providing a second ohmic contact to said intermediate layer.

In accordance with a further feature of the invention, the three respective layers are of N type impurity and the compensation is of P type impurity, the compensation being by gold introduced in a concentration of in the neighborhood of three times the ionized donor concentration of the N type impurity in the epitaxial layer.

The novel and distinctive features of this invention are set forth in the claims appended to this specification. The invention itself, however, together with the further objectives and advantages thereof may best be understood by reference to the following description and accompanying drawing in which:

Figure 1:
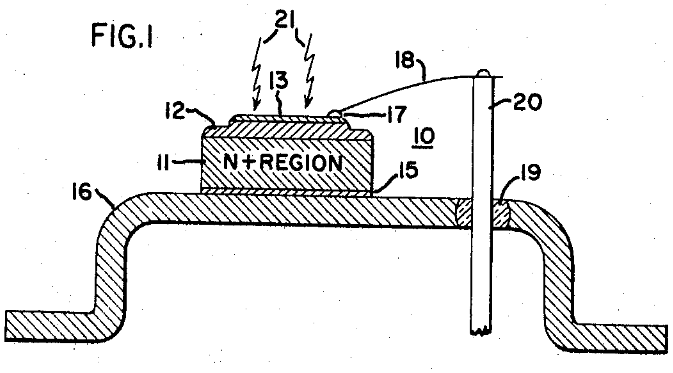
FIGURE 1 is a sectional view of an embodiment of the invention applicable to electrical circuitry in which individual electrical components are employed.

Referring now to FIGURE 1, there is shown a sectional view of the photodetector 10 which is of a generally sandwich-like structure. The photodetector consists of three principal layers with suitable electrical connections. The first layer 11 is typically of from 5 to 20 thousandths of an inch of degenerately doped N+ type silicon substrate. On its upper surface, as viewed in FIGURE 1, a second layer 12 is formed. It is epitaxially grown, and is of moderately doped N type silicon compensated by a general gold diffusion throughout the layer. The third layer 13 is a second degenerately doped N+ region diffused into the central portion of the upper surface of the epitaxial layer 12. External connections are made to the N+ layers 11 and 13 respectively of gold-antimony or gold alloy bonds. The contact to layer 11 is illustrated at 15 and takes the form of an alloy bond to the conductive member 16. The member 16 may be a header or some other means for supporting the photodetector in situ. The other electrical contact, shown at 17, consists of a fine wire 18 alloy bonded to the upper surface of the layer 13.

The embodiment of the photodetector illustrated in FIGURE 1 is physically arranged for employment in an electrical circuit wherein individual electrical components are employed. In this application, header support is typical. The header consists of a principal conductive member having a form resembling a straw hat and having at least one lead attached thereto by means of a glass-to-metal seal as shown at 19. The fine contact wire 18 is then bonded to the external lead 20. The overall assembly is achieved in a manner which is common in the manufacture of semiconductor devices.

The sandwich arrangement is designed to detect light directed downwardly upon the upper layer 13 of the photodetector, as illustrated by arrows 21 of FIGURE 1. The optically active region of the photodetector is the compensated epitaxially grown layer 12, to which the degeneratively doped regions 11 and 13 form the electrical contacts. In order to permit a substantial amount of light to be absorbed in the active region of the photodetector, the upper layer 13 is made of minimum thickness to achieve maximum optical transparency consistent with minimum electrical resistivity. The region may typically be on the order of one micron in thickness. The epitaxial layer has a thickness selected to achieve maximum optical absorptivity compatible with minimum transit time, the latter of which falls as the thickness of the active region increases. Also the maximum thickness is limited by bias voltage and hence power dissipation considerations. This dictates a thickness of approximately one thousandth of an inch which corresponds to 63% absorptivity at typical infrared wavelengths of 8 to 10 thousand angstrom units in silicon. The invention may be equally applicable to a shorter wavelength provided, of course, that suitable accommodation is made for the increase of opacity of the uppermost N+ contact region. These would tend to dictate a reduction in the thickness of the conductive upper surface as a minimum of 1/10 of a micron compatible with diffusion techniques and the epitaxial region itself to two microns for light in the visible region. Electrical conductivity of the upper layer may be improved by employing a tin oxide layer which is more transparent to visible light.

The photodetector may be quite small; and may have a total active region of as little as .015 to 0.09 $cm.^2$. Larger dimensions to avoid alignment problems may be employed without electrical penalty until the circuit time constant becomes limited by the device capacitance.

Figure 2:
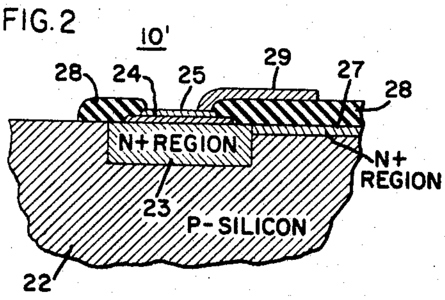
FIGURE 2 is a sectional view of a second embodiment of the invention applicable to monolithic or integrated circuit fabrication techniques.

The invention is equally well adapted to fabrication by monolithic circuit fabrication techniques as illustrated in FIGURE 2. Here the principal support member is a substrate 22 of lightly doped P type material acting as an insulating support for the photodetector 10'. The configuration is also wafer-like in that it consists of a lower degeneratively doped N+ region 23, a compensated epitaxially grown layer 24, on the surface of which a very thin degeneratively doped N+ region 25 is formed. The electrical circuit connection is made to the N+ region 23 by the surface diffused N+ conducting layer 27 contacting its outer perimeter. Insulating layer 28 then insulatingly supports the contact 29, coupled to the upper conductive region 25. This construction and variations thereof may be achieved by well known monolithic circuit fabrication techniques.

Figure 3:
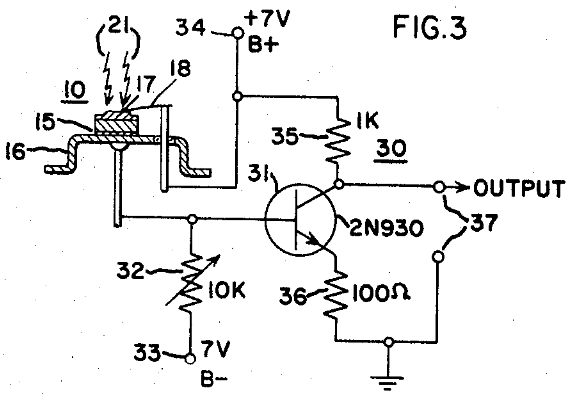
FIGURE 3 is a schematic circuit diagram of a light detection arrangement incorporating applicant's novel photodetector.

Electrically, the novel photodetector may be regarded as a variable conductance device whose conductivity is variable in response to variations in the intensity of incident radiation. One circuit application of the invention is illustrated in FIGURE 3, wherein a silicon detector 10 is illustrated connected in electrical circuit with an amplifier 30 to provide an electrical output signal responsive to input radiation 21. Typical circuit values have been illustrated on the drawing. The transistor amplifier 30 comprises a transistor 31 connected in common emitter configuration, having its base electrode coupled jointly to the terminal 15–16 of the photodetector and to a resistance 32 leading to a source 33 of negative bias potentials. The other terminal 17–18 of the photodetector is coupled to a source 34 of positive potentials. By these connections, the photodetector 10 and the resistance 32 form a voltage divider for adjusting the base potential of the transistor 31 in accordance with the instantaneous conductivity of the photodetector 10. The source 34 also energizes the transistor 31 through load resistance 35 coupled to the collector thereof. The emitter is grounded through resistor 36. Electrical output voltages appear at the output terminals 37. One terminal of the output terminal 37 is grounded. The ungrounded output terminal is coupled to the collector of transistor 31. The above configuration may be energized by sources 33 and 34 of from 5 to 10 volts, with the resistance 32 being set to have approximately the average resistance exhibited by the photodetector 10 and thereby permit the transistor 31 to operate with the customary slight forward bias. The wiring configuration illustrated in FIGURE 3 is not a part of the present invention and is representative of one of the many configurations in which the invention may be employed.

Photodetectors of the design herein disclosed may be employed with light modulation frequencies as high as a megacycle. In terms of the device's more fundamental electrical properties, measured response times of actual devices have varied from $2\times10^{-7}$ seconds to $10^{-6}$ seconds, dependent upon the operating light levels. Steady state quantum gains of 60 have been measured and the detectivity of typical devices has been $9.5\times10^{9}$ cm. $(c.p.s.)^{1/2}$/watt. This unique combination of properties is attributable in part to the layer-like configuration of the photodetector which minimizes the path length of carriers in the active region of the photodetector and in part to the use of gold compensation which makes it possible to achieve sufficiently short carrier lifetimes to achieve high frequency operation, and sufficiently high electron mobility to achieve high quantum gain.

In order to achieve a better understanding of the essentials of the inventive photodetector structure, which permits achieving this performance, further reference will now be made as to the method for making the device and the essential properties of its participant regions.

The arrangement illustrated in FIGURE 1 provides a thin active region of approximately one-thousandth of an inch thickness for 9000 A. applications, which will support an electric field of at least $3\times10^{3}$ volts/cm. and sustain it with a bias of about 10 volts. The mesa construction of the upper conducting layer improves the voltage distribution of the device and avoids voltage breakdown at the perimeters of the device. Use of a high field minimizes the electron transit time. Since the quantum gain varies inversely with the carrier transit time ($t_n$), optimum quantum gain from this viewpoint is achieved. The field gradients will not ordinarily exceed this approximate value ($3\times10^{3}$ volts/cm.), since above this value, the electron mobility in these materials appears to fall off with increasing electric field. A further increase in the bias by another order of magnitude brings about another increase in current apparently attributable to impact ionization. Ordinarily, the device is operated at the upper limits of the initial pre-ionization region and transit times on the order of $10^{-8}$ sec. may be achieved.

In fabrication, the starting member 11 may be of degenerately doped N type material having a bulk resistivity typically of from 0.001 to .01 ohm cm. The epitaxial layer superimposed thereon is also commercially available, with lightly doped resistivities of a few ohm cms. Typically they are available at the 1 ohm cm.; 1.8 ohm cm.; and 5 ohm cm.

The silicon substrate is then subjected to a phosphorous diffusion at approximately 1100° C. to form the uppermost conductive region 13. The time of diffusion was set so that the diffusion depth was approximately one micron and the sheet conductance 50 ohms per square. After phosphorous diffusion, the wafer was rinsed in hydrofluoric acid to remove any oxides which might have formed on the surface. Then it was rinsed in alcohol and transferred directly into a vacuum evaporator for achieving gold compensation. A thin layer of gold, approximately 500 angstroms thick was then deposited on the exposed surface of the device (already containing the diffused N+ region). After the gold deposition, the wafer was sealed and inserted in a furnace. Gold diffusion was then carried out at a temperature of 1060° C. for the one ohm centimeter material. A lower temperature of 1000° C. is appropriate for the 1.8 ohm cm. epitaxial material. Diffusion for both samples should be continued for at least three hours. This selection of temperatures is designed to provide for a gold saturation density corresponding to a gold atom concentration of approximately three times the ionized donor concentration exhibited in the epitaxial layer due to its original impurity concentration at normal operating temperatures.

Following gold diffusion, the wafer was etched in aqua regia to remove any gold adhering to the surface. Finally, the upper regions were etched to form the mesa illustrated in FIGURE 1.

In order to reduce donor impurity migration problems during the growing of the epitaxial layer, it is conventional to use an antimony dopant for the lowermost degenerate layer and to use phosphorous dopant for the epitaxial region which is of (1 1 1) crystalline orientation. The uppermost contact layer is also preferably of phosphorus to achieve more rapid diffusion. The diffusion rates of antimony or arsenic are relatively slow and any prolonged heating may disturb the preexistent dopant distributions.

The above processing techniques lead to a finished semiconductor having no true junctions and having in succession the lowermost degenerately doped N+ region furnishing an ohmic contact, the central region of moderately doped epitaxially grown silicon with an approximately uniform diffusion of the gold compensating atoms therein, and finally on the upper surface, the heavily doped upper N+ region. The gold diffusion concentrations are several orders of magnitude below those required to achieve any compensation of the heavily doped contact regions and so have no appreciable effect there. While theoretical considerations tend to dictate that the gold compensation approach the point at which the central epitaxial region is converted from an N to a P type region, the degree of improvement is relatively small after one has exceeded a ratio of gold impurities to net ionized donors of 5 to 1. P regions should be avoided since they imply the formation of junctions inhibiting the free passage of electrons through the central region. Measured in terms of the ratio of light to dark conductivity, the greatest rate of improvement occurs when this ratio is 3 to 1, although substantial improvement occurs from a point at which the ratio is 1 to 1. The relationship is graphically illustrated in FIGURE 4. These considerations normally dictate operation in the vicinity of a 3 to 1 ratio, since experience has shown that a much greater degree of compensation converts portions of the epitaxial layer into P regions. In terms of free electron removal this corresponds to the removal of free electrons from the conduction band by a factor of about $10^4$.

The concentration of gold compensating atoms begins to have an effect when they are of approximately $1/10$ the density of ionized donors. When the concentration of gold atoms is $1/3$ that of the ionized donors, a 30% reduction in free electrons is achieved. When the number of gold atoms is made equal to the ionized donors, free electron density falls by a factor of 100 from their original value and when the gold concentration is three times that of the ionized donors, a reduction in free electrons by approximately $10^4$ is achieved. Beyond this point additional gold atoms continue to bring about a substantial reduction in free electrons but beyond this last point, there is a very substantial chance of forming P regions. In the case under consideration from which the foregoing figures were derived, the epitaxial material was of 5 ohm cm. resistivity, corresponding at room temperature to an ionized donor concentration of $10^{15}$ per cc. The maximum usable gold concentration was $10^{16}$ atoms per cc. Calculations have shown that compensation of materials doped with other densities of shallow donors begin to respond to compensation when the gold is down by a factor of 10 from the net ionized donor concentration and tend to optimize at a point where the gold atoms exceed the free ions by a factor of 3. At this point the improvement in dark resistivity is very substantial, being close to $10^4$. Beyond the point where the ratio of gold ionized donors exceeds the ratio of 10 to 1, the material has been converted to a P type material. The concentration of gold atoms should ordinarily be on the order of three times the ionized shallow donor density.

The removal of free electrons from the conduction band in a doped semiconductor by the deliberate addition of doping impurities of the opposite type is referred to as "compensation." To understand the meaning of the term, some reference must be made to the underlying physics of semiconductors.

Prior to doping and prior to compensation, the semiconductor may be regarded as a crystalline material having electrons bound by covalent bonds. They are immobile until excited by the application of sufficiently high energy (1.12 electron volts for silicon) to excite them into the conduction band. Each silicon atom is bound to four other adjacent atoms by four such covalent bonds. Each silicon atom adds four electrons of its own to these bonds and at the same time shares one electron contributed by each of its four immediate neighbors. Thermal energy may force a small number of electrons in pure silicon from the covalently bound condition into an unbound condition and thus permit a small amount of conduction. The relatively low energy level of the covalent bond compared to ionic bonds is such that substantial numbers of so-called semiconductors do become highly conductive at higher temperatures. At room temperature, however, most electrons are bound in the "valence band" and relatively few are given adequate energy to jump the band gap into the "conduction band" and thus the conduction is low.

In order to develop greater conductivity in semiconductors at ordinary room temperatures, the semiconductor is doped with impurities of the so-called "shallow level" donor (or acceptor) variety. The effect of doping (in the simplest model) is to make a substitution within the silicon crystal of a doping atom such as phosphorus for a silicon atom. The phosphorus atom has essentially five electrons available for crystalline bonds whereas silicon has four. At thermal temperatures close to absolute zero, phosphorus will be bound to three adjoining silicon atomic centers with ordinary covalent bonds and perhaps to the fourth by a kind of tri-valent bond. Three of the phosphorous electrons enter into the covalent bonds and the other two into the tri-valent bond. This last bond assures electrical neutrality of the phosphorous center, but the thermal energy required to remove an electron in that bonded condition from the phosphorus is quite small, being 0.044 electron volt measured below the conduction band edge. This corresponds to an energy at which thermal activity at ordinary room temperatures will provide a very large number of liberated electrons and thus make the semiconductor highly conductive at room temperatures. Impurities of the shallow donor (and shallow acceptor) variety are those which at room temperatures provide a ready supply of electrons in the conduction band (or holes in the valence band).

Compensation implies the removal of electrons from the conduction band (or holes from the valence band). It is achieved in a semiconductor already doped by so-called shallow impurities by the introduction of opposite type impurities having "deep" levels. The term "deep" implies that at ordinary room temperatures very few of these donor (or acceptors) are thermally ionized. The deep impurities thus exist primarily in an electrically neutral state and do not increase the conductivity of the semiconductor at room temperatures.

Gold, which is herein used for compensation of a semiconductor having a shallow donor impurity, is characterized, by a deep acceptor level of 0.56 electron volt and a deep donor level of 0.35 electron volt both measured above the valence band. The gold impurity centers have the effect of capturing electrons and holes developed by the shallow level impurities in their transit through the semiconductor material. In the presence of only thermal stimulation at room temperature, there are few free electrons and the conductivity of the semiconductor has been greatly reduced by such compensation—by a factor of as much as $10^4$.

Figure 4:
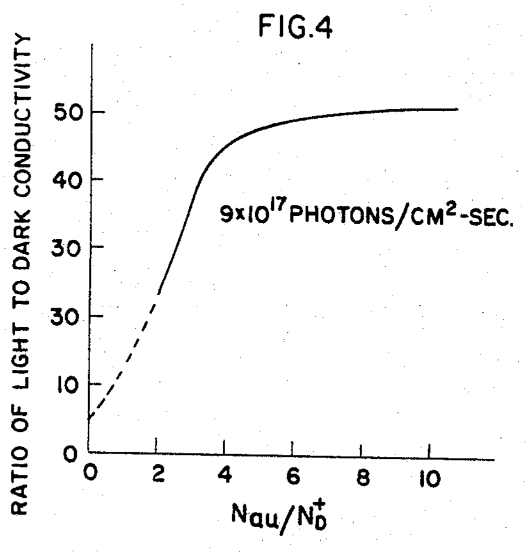
FIGURE 4 is a graph illustrating the influence of different levels of compensation upon the ratio of light to dark conductivity at a given light flux level.

Reference to FIGURE 4 shows that the ratio of light to dark conductivity in the photodetector (for a photon flux of $10^{17}$ photons/cm.$^2$ sec.) is enhanced from a factor of approximately 5 to 1 to a factor approaching 50 to 1 by the compensation.

A second effect of the presence of compensating atoms is upon the carrier lifetimes. Both electron lifetimes and hole lifetimes are substantially reduced by the presence of the gold. Electrons are captured by interaction with the relatively small number of positively ionized gold centers and by the somewhat larger number of neutral gold centers. Similarly, the holes are captured by the negatively charged gold centers as well as by the neutral gold centers.

Translated into electrical performance criteria, a shortened carrier lifetime, which is proportional to the response time of the photodetector leads to a shortened response time. The presence of compensation, therefore, permits practical devices to achieve response times as short as .2 of a microsecond (a speed which falls off with decreasing light intensity to a figure of one microsecond).

The mechanism by which the light interacts with the semiconductor gives rise to considerable gain. Radiant energy in the infrared, near red and visible light region corresponds to much higher energy than the thermal energy at room temperatures and is high relative to that required to liberate an electron from the covalent bond. When a semiconductor such as silicon is exposed to photon energies of this nature, electrons are excited from the valence band directly into the conduction band and corresponding holes are formed without the need for impurity centers. (This is called intrinsic photoconductivity.) The mechanism is principally responsible for light conductivity in the arrangement of the present invention. Assuming that an electron-hole pair has been created by the absorption of a photon, the two oppositely charged carriers migrate through the epitaxial region of the photodetector under the influence of the very substantial applied field. Since the field is high, the electron crosses the gap in periods approximating $10^{-8}$ seconds. The hole on the other hand, continues its travel through the semiconductor at a somewhat slower rate. When it approaches the electrodes, it is not extinguished but continues to exist in the active region of the photodetector for its normal lifetime. The requirement that the active region of the photodetector be electrically neutral, permits the electron replenishing contact electrodes to supply new electrons to the active region continuously throughout the lifetime of the hole. In practice, it has become customary to refer to the photoconductive gain of semiconductor devices as the ratio between the carrier lifetime and the transit lifetime. Since only electrons are replenished at the contacts of the photodetector, the transit time employed in consideration of the present arrangement is that of the electron.

The photoconductive gain is given by:

$$G=\tau_n/t_n$$

where $\tau_n$ is the electron lifetime dictated by the carrier pair lifetime. This lifetime is generally dictated by the shorter lifetime of the minority carrier. The carrier pair (and hence electron) lifetimes as determined from device gain measurements and calculated transit time values are in good agreement with lifetimes calculated from capture cross section data. As indicated earlier, the transmit times are on the order of $10^{-8}$ seconds. Accordingly, assuming that carrier liftimes are $10^{-6}$ seconds, quantum gains on the order of 100 are predicted. Experimental results have shown steady-state quantum gains of up to 60.

The effect of compensation is to directly reduce the carrier lifetimes and thus reduce the quantum gain of the device. However, if a sandwich configuration as that herewith proposed is employed permitting very substantial acceleration potentials and short transit times, it may be seen that a highly satisfactory compromise in gain and bandwidth has been achieved.

In addition to gold compensation, other materials of the deep acceptor variety may also be employed for shallow donor compensation. While gold is now believed to contain both deep acceptor and deep donor levels that enter into the mechanism of operation of the photodetector, the principal effect is that of the deep acceptors which absorb electrons. While the invention has been described employing gold for providing deep acceptor levels, other materials such as zinc, copper and indium may also be employed. These compensating elements should be added in such quantities, in accordance with the invention, as to effectively depopulate free electrons from the conduction band in the epitaxial region. Preferably their concentration should approach the point of maximum compensation consistent with avoiding the creation of a P region and hence rectifying contacts.

While the epitaxial layer, for fabrication convenience is preferably doped with phosphorus, other shallow level donors may be employed in that region. In addition, while an essentially N type photodetector has been described using P type deep level compensation, one may also employ a P type device having N type compensation by deep donor materials. Several considerations, however, including lower power dissipation in the device, favor N type materials using P type compensation. Similarly, while the invention has been disclosed in a specific configuration wherein the basic semiconductor material is silicon, the principles of compensating an epitaxially grown light interactive region by deep donor or acceptor levels may also be applied to other semiconductor materials, such as germanium. At the present time, germanium is not highly regarded for integrated circuit applications in part because of its lower resistivity and in part for certain other properties, thereby restricting the range of useful application of this particular construction.

Figure 5:
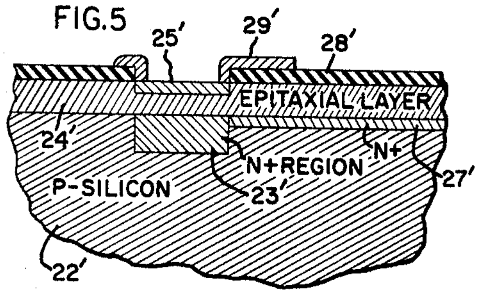
FIGURE 5 is a sectional view of a third embodiment of the invention applicable to monolithic or integrated circuit fabrication techniques.

In addition to the "mesa" type configuration, as those configurations in FIGURE 5 and FIGURE 2 might be characterized, a three-layer arrangement may also be employed, wherein the epitaxial layer is more general and not confined to a mesa. Such an arrangement is illustrated in FIGURE 5, in which primed reference numerals have been used to indicate elements performing corresponding functions to those elements first indicated in FIGURE 2. The lowermost contact region, numbered 23' is formed by diffusion into the P silicon substrate 22' and contact means for connection to adjacent circuitry are provided by the diffused conductor 27'. The epitaxial layer 24' is more extensive than in the FIGURE 2 embodiment and extends beyond the immediate environs of the contact region 23', as for instance to other devices requiring an epitaxial region. A portion of the upper surface of the epitaxial region, opposite to the lower contact region 23', is provided with the second contact region 25', which is diffused into the surface of the epitaxial layer 24'. A general insulated layer 28' covers much of the epitaxial layer 24' and serves as a mask during gold compensation of the epitaxial region. It also supports contacts 29' made to the upper contact member 25'.

While specific embodiments of the invention have been shown, modifications and changes therein may be made by those skilled in the art without departing from the spirit of the invention. Accordingly, it is intended in the appended claims to cover all such modifications.

What is claimed as new and desired to be secured by Letters Patent of the United States is as follows:

1. A high speed silicon photodetector comprising a first silicon layer heavily doped with a shallow level impurity of a first conductivity type to provide a low resistivity ohmic contact, an epitaxially grown second layer of a thickness suitable for radiation absorption formed upon one surface of said first layer, said epitaxial layer being of silicon, moderately doped with a shallow level impurity of said first type and being compensated by an opposite type of impurity having deep levels, in a concentration sufficient to depopulate free carriers in said second layer due to said first impurity but inadequate to convert it to an opposite type; and transparent contact means comprising a third layer arranged on said epitaxial layer heavily doped with a shallow level impurity of said first type and providing a light permeable ohmic contact thereto.

2. A high speed photodetector as set forth in claim 1 wherein said first and third layers are doped with N type impurities and wherein said epitaxial layer is compensated by a P type impurity.

3. The arrangement set forth in claim 1 wherein said epitaxial layer has a thickness of approximately 0.001 inch.

4. The arrangement set forth in claim 1 wherein said three layers are of N type silicon, and wherein said third layer is a diffused region on the free surface of said epitaxial second layer.

5. The arrangement set forth in claim 1 wherein said compensating material is gold having a concentration on the order of three times the concentration of ionized shallow donors in said epitaxial layer at room temperature.

6. The arrangement set forth in claim 5 wherein said epitaxial layer is doped to a resistivity lying in the region of from ½ to 10 ohm cm.

7. The arrangement set forth in claim 6 wherein said epitaxial layer and said third layer have a phosphorous shallow donor impurity.

8. The arrangement set forth in claim 7 wherein said first layer is a silicon substrate, said second layer is an epitaxial layer thereon and said third layer is a part of said epitaxial layer appropriately doped for conduction, said latter two layers being partly removed to form a mesa to reduce electrical fields at the perimeter of the device.

References Cited

UNITED STATES PATENTS

| | | | |
|---|---|---|---|
| 2,860,218 | 11/1958 | Dunlap | 338—15 |
| 3,310,502 | 3/1967 | Komatsubara et al. | 338—15 |
| 3,324,358 | 6/1967 | Memelink | 317—234 |
| 3,337,793 | 8/1967 | Gibbons et al. | 317—234 |

JOHN W. HUCKERT, *Primary Examiner.*

JERRY D. CRAIG, *Assistant Examiner.*

U.S. Cl. X.R.

250—211; 307—311